(12) United States Patent
Park et al.

(10) Patent No.: US 7,307,281 B2
(45) Date of Patent: Dec. 11, 2007

(54) METHOD OF MANUFACTURING SUBSTRATE, METHOD OF MANUFACTURING ORGANIC ELECTROLUMINESCENT DISPLAY DEVICE USING THE METHOD, AND ORGANIC ELECTROLUMINESCENT DISPLAY DEVICE

(75) Inventors: Jin-woo Park, Yongin (KR);
Ho-Kyoon Chung, Yongin (KR);
Seung-yong Song, Kyungki-do (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/390,441

(22) Filed: Mar. 28, 2006

(65) Prior Publication Data

US 2006/0163565 A1 Jul. 27, 2006

Related U.S. Application Data

(62) Division of application No. 10/726,667, filed on Dec. 4, 2003, now Pat. No. 7,049,161.

(30) Foreign Application Priority Data

Dec. 14, 2002 (KR) .............................. 2002-80054

(51) Int. Cl.
*H01L 29/22* (2006.01)
(52) U.S. Cl. .................. 257/40; 257/98; 257/347; 257/350; 257/E51.001; 257/E27.117
(58) Field of Classification Search .............. 257/40, 257/98, 347, 350, E51.002–E51.006, E27.116–E27.119
See application file for complete search history.

(56) References Cited

U.S. PATENT DOCUMENTS

| 5,811,348 | A | 9/1998 | Matsushita et al. |
| 5,821,138 | A | 10/1998 | Yamazaki et al. |
| 6,107,213 | A | 8/2000 | Tayanaka |
| 6,194,239 | B1 | 2/2001 | Tayanaka |
| 6,194,245 | B1 | 2/2001 | Tayanaka |
| 6,326,280 | B1 | 12/2001 | Tayanaka |
| 6,413,838 | B2 * | 7/2002 | Itoh .......................... 438/462 |

(Continued)

FOREIGN PATENT DOCUMENTS

CN      1312590      9/2001

(Continued)

OTHER PUBLICATIONS

U.S. Appl. No. 10/726,667, filed Dec. 4, 2003, Jin-Woo Park et al.
Office Action issued in Chinese Patent Application No. 200310120282.0 on Feb. 9, 2007.

*Primary Examiner*—Zandra V. Smith
*Assistant Examiner*—Toniae M Thomas
(74) *Attorney, Agent, or Firm*—Stein, McEwen & Bui, LLP

(57) ABSTRACT

A method of manufacturing an organic electroluminescent display device includes preparing an auxiliary substrate, which has a flat side; forming a first protective layer on the auxiliary substrate; forming an organic electroluminescent unit on the first protective layer; bonding a flexible main substrate onto the organic electroluminescent unit; and etching the auxiliary substrate to remove the same.

9 Claims, 6 Drawing Sheets

U.S. PATENT DOCUMENTS

| | | |
|---|---|---|
| 6,426,274 B1 | 7/2002 | Tayanaka |
| 6,512,469 B1 * | 1/2003 | Azami et al. ............... 341/100 |
| 6,781,152 B2 | 8/2004 | Yamazaki et al. |
| 2001/0040645 A1 | 11/2001 | Yamazaki et al. |

FOREIGN PATENT DOCUMENTS

| | | |
|---|---|---|
| JP | 9-7763 | 9/1997 |
| JP | 2000-123971 | 4/2000 |

* cited by examiner

METHOD OF MANUFACTURING SUBSTRATE, METHOD OF MANUFACTURING ORGANIC ELECTROLUMINESCENT DISPLAY DEVICE USING THE METHOD, AND ORGANIC ELECTROLUMINESCENT DISPLAY DEVICE

CROSS-REFERENCE TO RELATED APPLICATIONS

This application is a divisional application of Ser. No. 10/726,667, filed Dec. 4, 2003, now U.S. Pat. No. 7,049,161, the disclosure of which is incorporated by reference. This application also claims the benefit of Korean Patent Application No. 2002-80054, filed on Dec. 14, 2002, in the Korean Intellectual Property Office, the disclosure of which is incorporated herein by reference.

BACKGROUND OF THE INVENTION

1. Field of the Invention

The present invention relates to a method of manufacturing a flexible substrate having a thin film, a method of manufacturing an organic electroluminescent display device using the method, and an organic electroluminescent display device.

2. Description of the Related Art

Flexibilization of flat display devices such as organic electroluminescent display devices and thin-film transistor-liquid crystal display (TFT-LCD) devices has been studied in various ways. In order to make display devices have flexibility, a flexible substrate is used. Such a flexible substrate is usually made of a synthetic resin. However, since flat display devices require complicated processing conditions for forming an organic layer, a TFT layer for driving a display device, an electrode layer, and an oriented layer according to their characteristics, when a substrate made of a synthetic resin is used, the substrate or thin films formed on the substrate may be deformed under the processing conditions.

To overcome this problem, Japanese Patent Publication No. 2000-123971 discloses a method of manufacturing an organic electroluminescent display device using a substrate made of a moisture-proof film. The organic electroluminescent display device includes two facing insulation substrates, at least one of which has flexibility and at least one of which has light transmissivity. An electrode layer is formed on the inside of each substrate, and an organic layer having a luminescent layer is disposed between the electrode layers. The method of manufacturing this organic electroluminescent display device includes forming an electrode layer and an organic layer on one substrate, forming an electrode layer and an organic layer same as that on the one substrate on the other substrate, and combining the two substrates such that the two organic layers are in close contact with each other.

In the meantime, Japanese Patent Publication No. hei 9-7763 discloses another method of manufacturing an organic electroluminescent display device. In this method, a transmissive anode layer and an organic thin film are formed on one moisture-proof film, a cathode layer and an organic thin film are formed on another moisture-proof film, and the two moisture-proof films are combined. In order to increase adhesion between the organic thin films, when the two moisture-proof films are combined, a resin layer formed by scattering an organic material on a resin binder is used, and the two moisture-proof films are pressed at a temperature where the resin binder is softened.

In the above-described methods, the organic layers are separately formed, and therefore, it is difficult to align the organic layers when the two substrates are combined. Furthermore, adhesion between all of the organic layers formed in predetermined patterns cannot be increased.

U.S. Pat. No. 6,426,274 discloses a method for making a thin film semiconductor. In this method, porous layers having different porosities are formed on a substrate having a surface layer, and an epitaxial semiconductor film formed on a porous structure is mechanically separated from the substrate using the porous structure.

In the meantime, U.S. Pat. Nos. 6,326,280; 6,107,213; 5,811,348; 6,194,245; and 6,194,239 disclose a method for manufacturing a thin film semiconductor and a method of separating a device formation layer from a base body.

SUMMARY OF THE INVENTION

The present invention provides a method of manufacturing a substrate by simple processes, thereby increasing productivity.

The present invention also provides a method of manufacturing an organic electroluminescent display device, in which all processes for manufacturing an organic electroluminescent display device are performed on a non-flexible auxiliary substrate, and then a resulting structure is moved onto a flexible substrate, thereby increasing reliability and yield.

The present invention also provides an organic electroluminescent display device including a flexible substrate.

According to an aspect of the present invention, there is provided a method of manufacturing a substrate. The method includes preparing an auxiliary substrate, which has at least one flat side; forming a first protective layer on the auxiliary substrate, the first protective layer being insoluble in a liquid etchant; forming at least one thin-film layer on the first protective layer; bonding a flexible main substrate onto the thin-film layer; and etching the auxiliary substrate to remove it.

Preferably, the auxiliary substrate is made of glass, and the flexible main substrate is made of a synthetic resin material having flexibility.

According to another aspect of the present invention, there is provided a method of manufacturing an organic electroluminescent display device. The method includes preparing an auxiliary substrate, which has a flat side and is non-flexible; forming a first protective layer on the auxiliary substrate; forming an organic electroluminescent unit on the first protective layer; bonding a flexible main substrate onto the organic electroluminescent unit; and etching the auxiliary substrate to remove it.

Preferably, the method further includes forming a second protective layer for planarizing the organic electroluminescent unit to be disposed between the organic electroluminescent unit and the main substrate, before bonding the main substrate. Preferably, the method further includes forming a third protective layer for protecting the main substrate from a liquid etchant on the main substrate, after bonding the main substrate.

According to still another aspect of the present invention, there is provided a method of manufacturing an organic electroluminescent display device. The method includes preparing an auxiliary substrate, which has a flat side; forming a first protective layer on the auxiliary substrate; forming an organic electroluminescent unit on the first protective layer; bonding a flexible main substrate onto the organic electroluminescent unit; and etching the auxiliary substrate to have a thickness allowing flexibility.

According to still another aspect of the present invention, there is provided an organic electroluminescent display device including a main substrate, which has a flat side and is flexible; a second protective layer, which is formed on the main substrate; an organic electroluminescent unit, which is formed on the second protective layer; a first protective layer, which is formed on the organic electroluminescent unit; and a sealing portion, which hermetically seals the organic electroluminescent unit.

The first protective layer comprises a plurality of layers to prevent permeation of oxygen, moisture, and a liquid etchant. The organic electroluminescent display device further includes a flexible sub-substrate bonded on to the first protective layer, and the sub-substrate is made of a synthetic resin material or glass. Meanwhile, the organic electroluminescent unit includes a second electrode layer, which is formed on the second protective layer; an organic layer, which is formed on the second electrode layer; a first electrode layer, which is formed on the organic layer; and a thin-film transistor layer, which is connected to the first electrode layer penetrating through an insulation layer to drive the first electrode layer. The thin-film transistor is positioned on the second electrode layer far away from the main substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
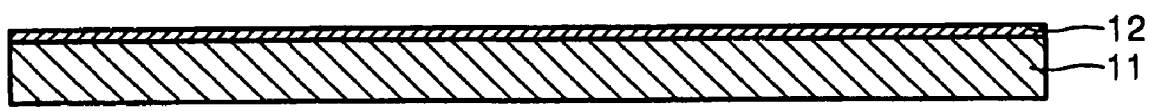
FIGS. 1, 2A-2C and 3 through 7 are diagrams illustrating stages in a method of manufacturing an organic electroluminescent display device according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

A method of manufacturing a substrate according to the present invention allows the production of a flexible image display device and minimizes defects occurring when an electrode, a thin-film transistor (TFT), or an organic layer are formed in manufacturing image display devices such as organic electroluminescent display devices.

In the method of manufacturing a substrate, an auxiliary substrate which is not flexible and has at least one flat side, i.e., a glass substrate, is cleaned and prepared. A first protective layer and at least one functional thin film for forming an image formation device are formed on a top surface of the auxiliary substrate. Then, a flexible main substrate is bonded to a top surface of the functional thin film using an adhesive. A second protective layer may be formed on a surface of the main substrate to prevent the main substrate from being damaged during an etching process. After completion of bonding of the main substrate, the auxiliary substrate is etched and removed.

FIGS. 1 through 7 are diagrams illustrating a method of manufacturing an organic electroluminescent display device using a method of manufacturing a substrate, according to an embodiment of the present invention.

As illustrated in FIG. 1, a first protective layer 12, which is insoluble in a liquid etchant such as hydrofluoric acid, hydrochloric acid, or a mixture thereof, is formed on a top surface of a non-flexible auxiliary substrate 11, i.e., a glass substrate. The first protective layer 12 is made of silicon (Si), an inorganic material, or metal to have a thickness of 100-1000 Å. In addition, the first protective layer 12 may be made of a composite layer including multiple thin films in order to prevent permeation of oxygen or moisture.

Figure 2A:
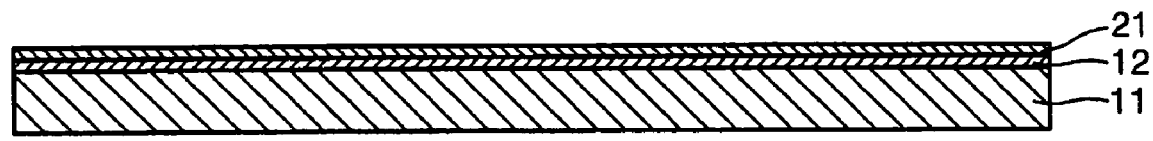
Figure 2B:
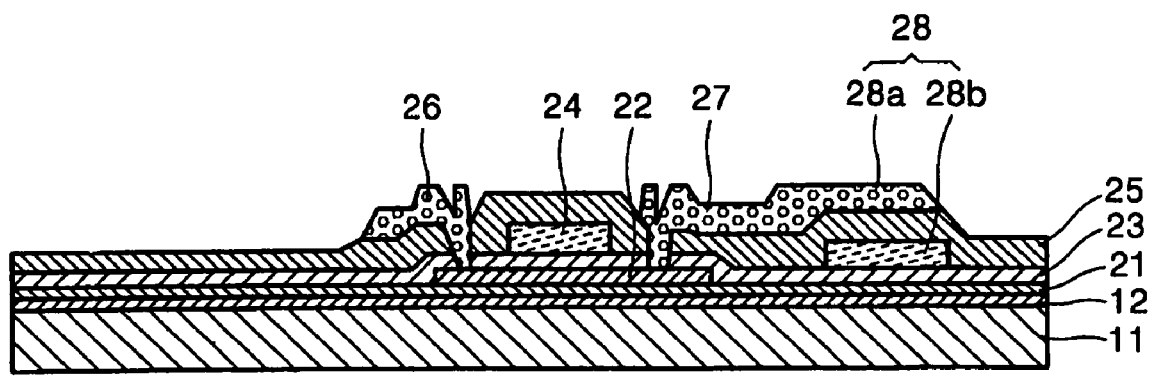
Figure 2C:
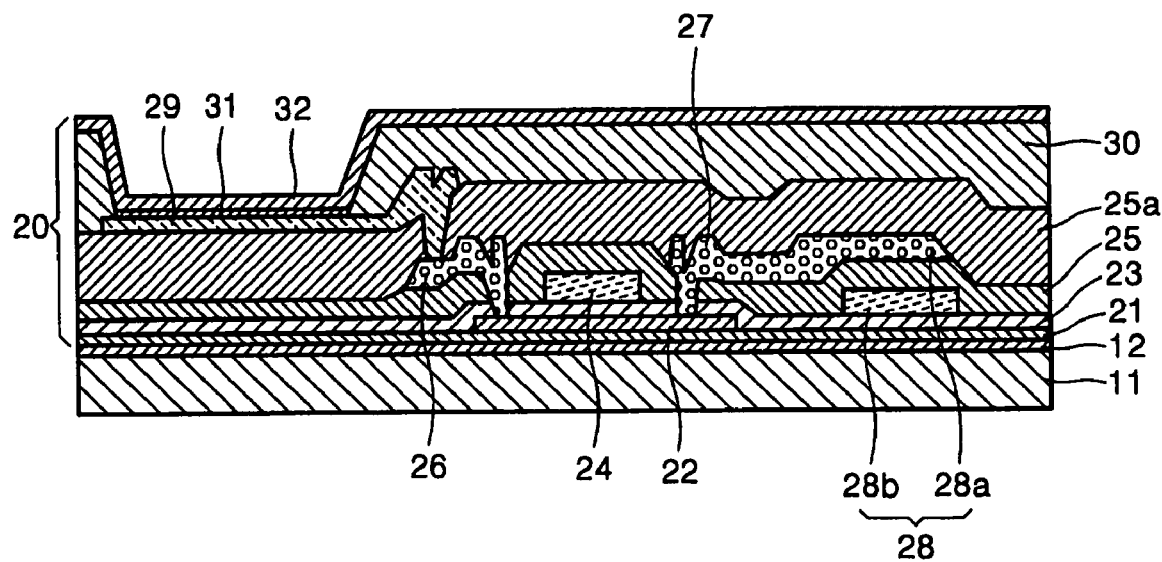

As illustrated in FIGS. 2A through 2C, an organic electroluminescent unit 20 is formed on a top surface of the first protective layer 12. The organic electroluminescent unit 20 can be formed as follows.

As illustrated in FIG. 2A, a buffer layer 21 is formed on the top surface of the first protective layer 12. As shown in FIG. 2B, a P or N type semiconductor layer 22 having a predetermined pattern and a gate insulation layer 23 covering the semiconductor layer 22 are formed on a top surface of the buffer layer 21. A gate electrode layer 24 corresponding to the semiconductor layer 22 and a first insulation layer 25 covering the gate electrode layer 24 are formed on a top surface of the gate insulation layer 23. Next, a TFT layer including a drain electrode 26 and a source electrode 27 is formed on the first insulation layer 25. The drain electrode 26 and the source electrode 27 penetrate the first insulation layer 25 and the gate insulation layer 23 and are electrically connected to opposite sides, respectively, of the semiconductor layer 22. Meanwhile, a first auxiliary electrode 28a is formed on a top surface of the first insulation layer 25 to face a second auxiliary electrode 28b, which is formed on a top surface of the gate insulation layer 23 during the formation of the gate electrode 24, thereby forming a capacitor 28. The first auxiliary electrode 28a is connected to the source electrode 27. Next, as illustrated in FIG. 2C, a second insulation layer 25a is formed on the top surface of the first insulation layer 25. A first electrode layer 29 is formed on a surface of the second insulation layer 25 to be electrically connected to the drain electrode 26. A third insulation layer 30 is formed on the top surface of the second insulation layer 25a such that the first electrode layer 29 is exposed. An organic layer 31 is formed on a top surface of the first electrode layer 29 using evaporation or printing. A second electrode layer 32, i.e., a cathode, is formed on a top surface of the organic layer 31 and the third insulation layer 30.

A method of manufacturing the organic electroluminescent unit 20 is not restricted to the above-described embodiment, but various modifications can be made thereto. In other words, the method can be changed according to the structure of the organic electroluminescent unit 20.

Figure 3:
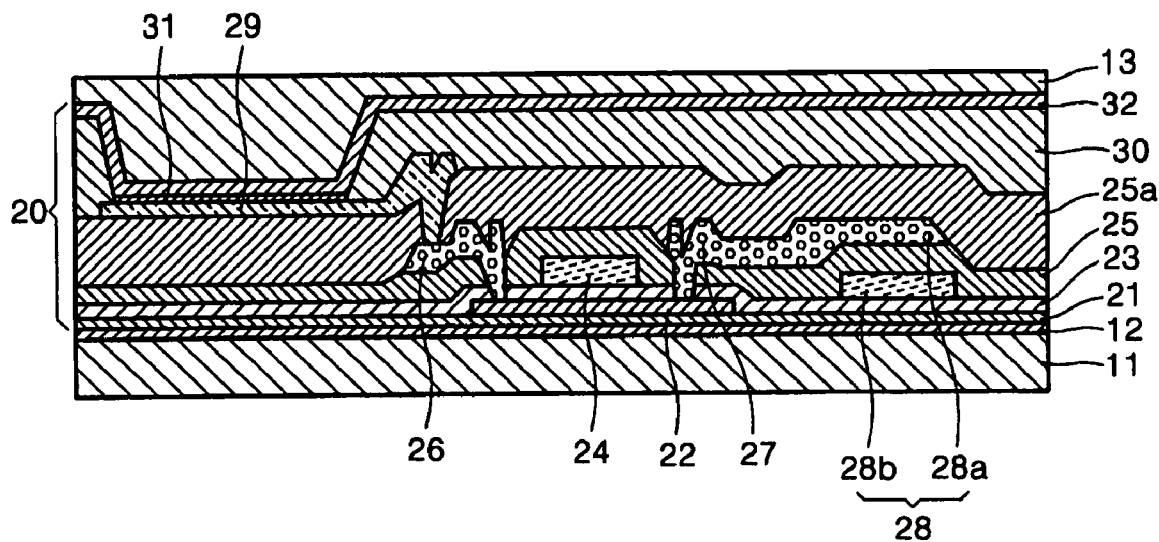
Figure 4:
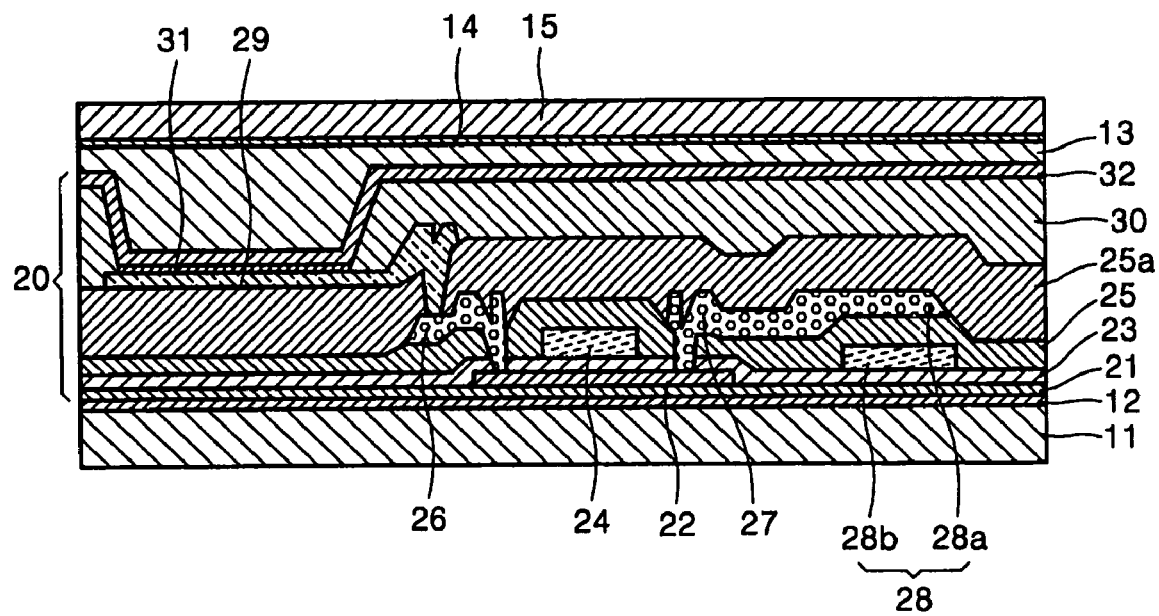

After the organic electroluminescent unit 20 is completed on the top surface of the first protective layer 12, as illustrated in FIG. 3, a second protective layer 13, i.e., a passivation layer, having heat resistance, chemistry resistance, and moisture resistance is formed on a top surface of the organic electroluminescent unit 20. The second protective layer 13 planarizes the top surface of the organic electroluminescent unit 20. After completing the second protective layer 13, as shown in FIG. 4, a flexible main substrate 15 is bonded onto a top surface of the second protective layer 13 using an adhesive 14. The flexible main substrate 15 may be made of a synthetic resin or a thin glass. In addition, the flexible main substrate 15 may be made of a composite layer including multiple thin films in order to prevent permeation of oxygen or moisture. In this case, preferably, the main substrate 15 has a thickness of 20-500 μm.

Figure 5:
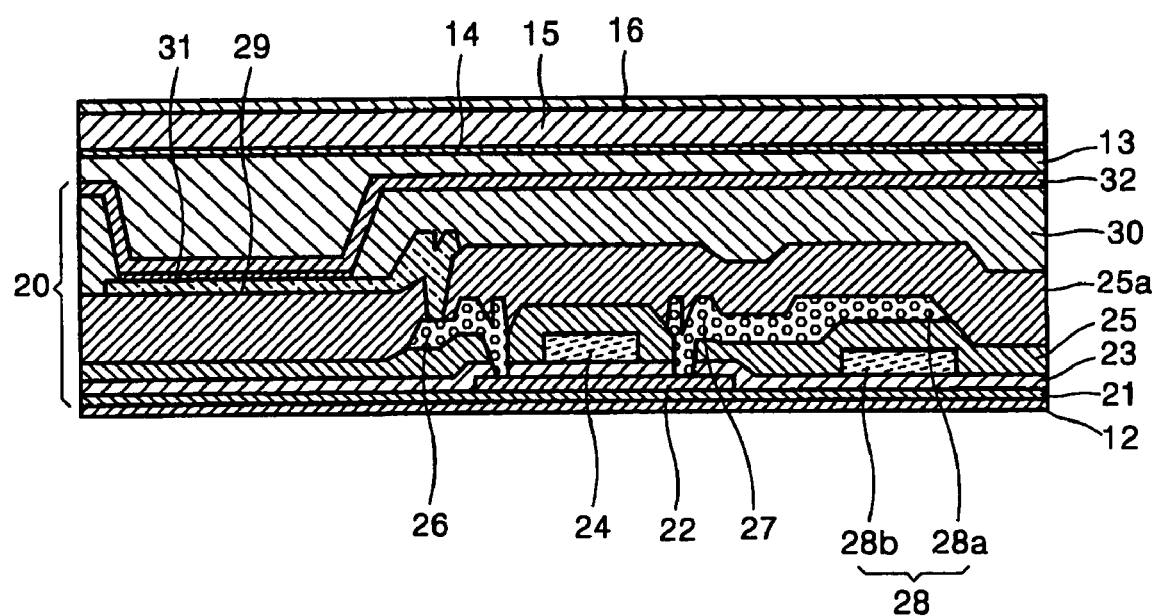

After the main substrate 15 is bonded, as illustrated in FIG. 5, the auxiliary substrate 11 made of a glass substrate is etched and removed. Before the etching process is performed, a third protective layer 16 may be formed on a surface of the flexible main substrate 15 in order to protect the surface of the flexible main substrate 15 from being damaged by a liquid etchant. It is apparent that a structure between the auxiliary substrate 11 and the main substrate 15 is hermetically sealed using a sealing material to prevent permeation of the liquid etchant. Any type of liquid that can etch a glass substrate can be used as the liquid etchant for the auxiliary substrate 11. Preferably, hydrofluoric acid, hydrochloric acid, or a mixture thereof is used.

Figure 6:
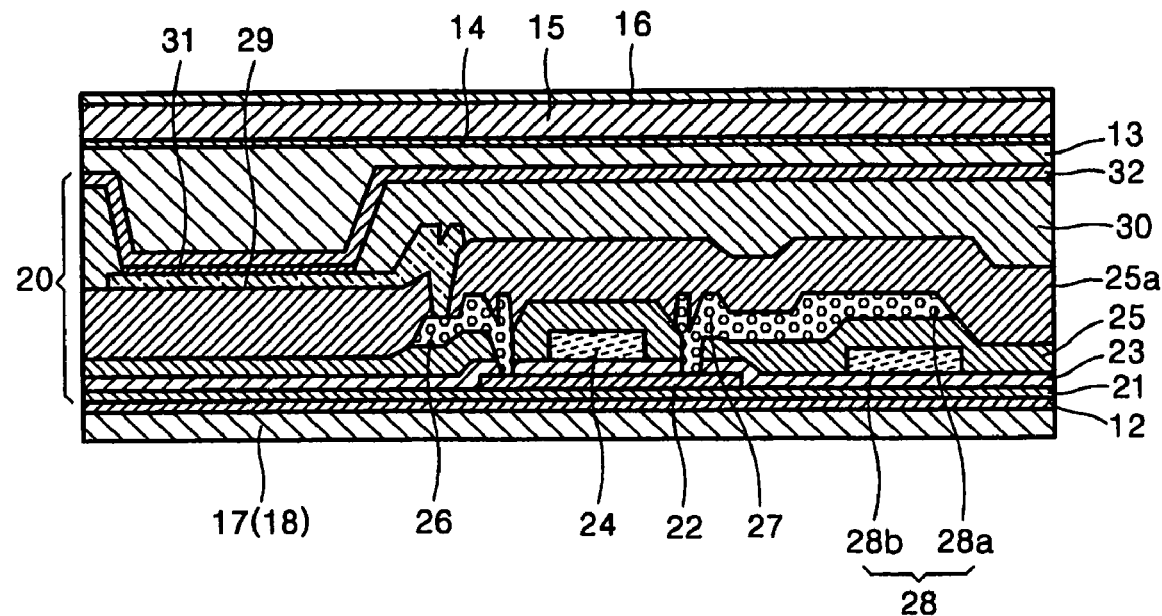

After the auxiliary substrate 11 is completely etched, as illustrated in FIG. 6, an organic layer protector may be formed on the first protective layer 12 to protect the organic electroluminescent unit 20. The organic layer protector may be implemented as an organic protection layer 17 made of a material having heat resistance, chemistry resistance, and moisture resistance or as a flexible sub-substrate 18 made of a synthetic resin or a flexible glass substrate.

Figure 7:
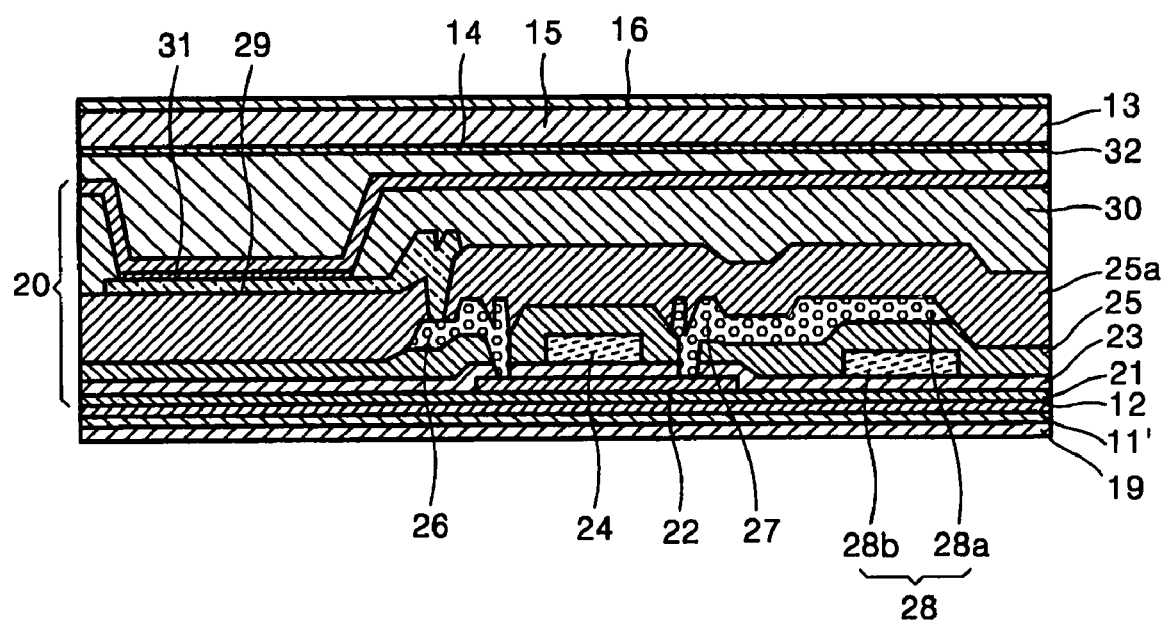

The organic layer protector can be implemented as the sub-substrate 18 made of a flexible glass substrate by remaining as the auxiliary substrate 11 having a thickness allowing flexibility, instead of completely removing the auxiliary substrate 11. In this case, as illustrated in FIG. 7, an organic protection layer 19 may be formed on an auxiliary substrate 11' remaining after the etching process so as to be used as the organic layer protector.

According to the above-described method, a flexible organic electroluminescent display device can be manufactured using a substrate made of a flexible synthetic resin material without changing the processing conditions for manufacturing an organic electroluminescent display device.

Figure 8:
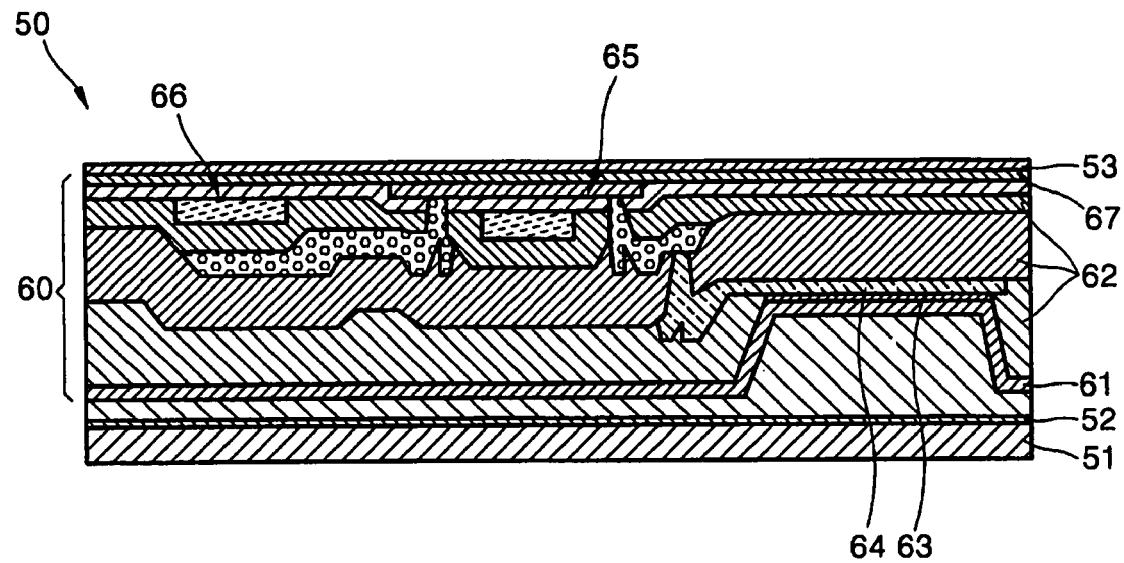
FIG. 8 is a cross-section of an organic electroluminescent display device according to an embodiment of the present invention.

FIG. 8 illustrates an organic electroluminescent display device 50 according to an embodiment of the present invention. The organic electroluminescent display device 50 includes a flexible main substrate 51 having a flat side, a second protective layer 52 formed on a top surface of the main substrate 51, an organic electroluminescent unit 60 formed on the second protective layer 52, and a first protective layer 53 formed on a top surface of a buffer layer 67 of the organic electroluminescent unit 60.

Figure 9:
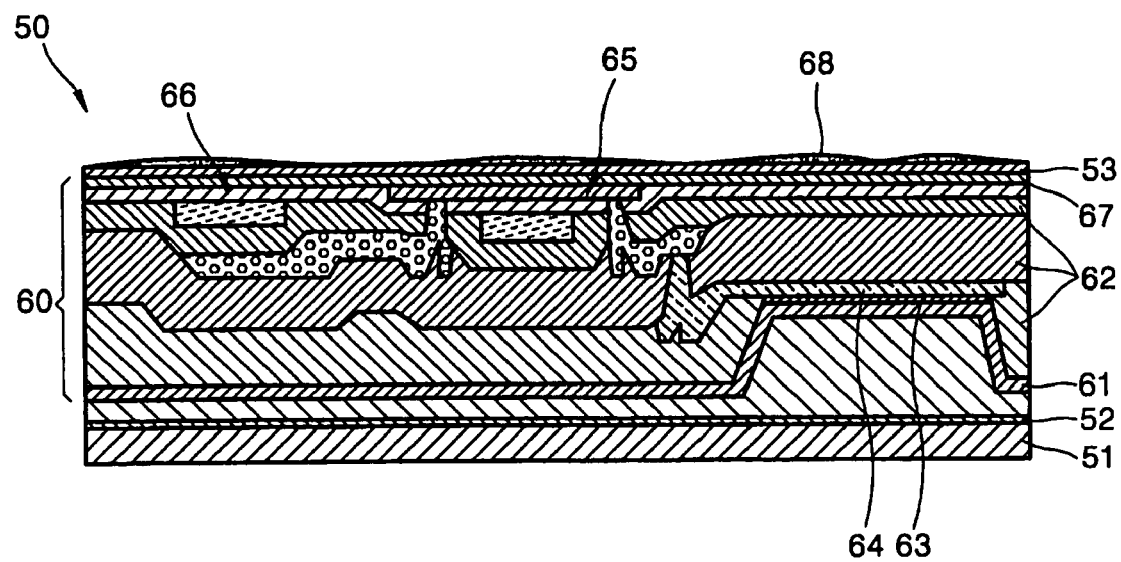
FIG. 9 shows a state in which a glass substrate partially remains after being etched in an organic electroluminescent display device according to the embodiment of the present invention.

The main substrate 51 may be made of a flexible synthetic resin material or a glass substrate having a thickness allowing flexibility. Preferably, the main substrate 51 has a thickness of 20-500 μm. The main substrate 51 may be formed using an inorganic thin film or a composite thin film including inorganic thin films in order to prevent permeation of oxygen and moisture. As illustrated in FIG. 9, after an auxiliary substrate 68 made of a glass material is etched, the auxiliary substrate 68 may partially remain on a top surface of the first protective layer 53.

In the organic electroluminescent unit 60, a second electrode layer 61 used as a cathode is formed on the second protective layer 52. A first electrode layer 64 corresponding to the second electrode layer 61 is formed on an organic layer 63 formed on the second electrode layer 61. A TFT layer 65 is formed on a top surface of an insulation layer 62 to be connected to the first electrode layer 64 through an opening formed in the insulation layer 62 in order to drive the first electrode layer 64. A capacitor layer 66 is formed on the insulation layer 62. The organic electroluminescent unit 60 has a structure in which the second electrode layer 61 used as a cathode is positioned near the main substrate 51, and the TFT layer 65 for driving the first electrode layer 64 is positioned above the second electrode layer 61.

The first protective layer 53, which is formed on the top surface of the organic electroluminescent unit 60 in order to prevent permeation of a liquid etchant, may include at least one inorganic protection film, at least one moisture/air proof film, and at least one hydrofluoric acid protection film. Preferably, the first protective layer 53 has a thickness of 50-5000 Å.

Figure 10:
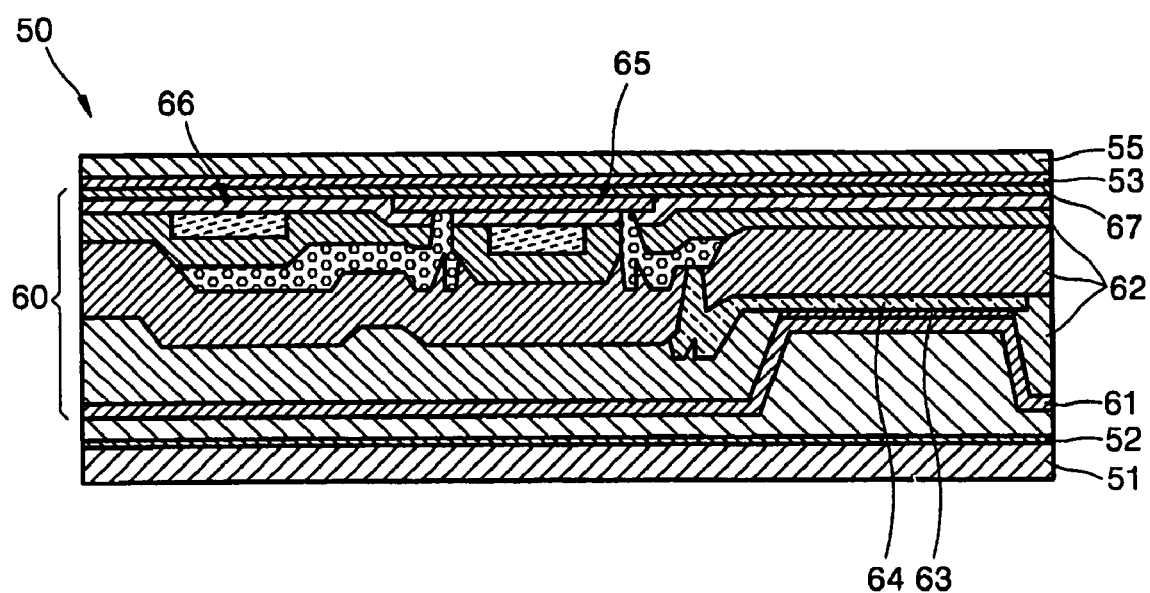
FIG. 10 is a cross-section of an organic electroluminescent display device according to another embodiment of the present invention.

In the meantime, a flexible sub-substrate 55 may be bonded onto a top surface of the first protective layer 53, as illustrated in FIG. 10. The sub-substrate 55 may be formed of a flexible plastic substrate made of a synthetic resin material or a glass substrate allowing flexibility. When the sub-substrate 55 is made of a flexible synthetic resin material, it may include at least one composite thin film and preferably have a thickness of 20-500 μm. When the sub-substrate 55 is made of a glass material, it preferably has a thickness of 20-400 μm.

In an electroluminescent display device having the above-described structure, when a predetermined voltage is applied to the first electrode layer 64 through a selected TFT and to the second electrode layer 61, holes injected from the first electrode layer 64 meet electrons generated from the second electrode layer 61 in a luminescent layer (not shown) of the organic layer 63, thereby generating exitons. When the exitons make transition from an exited state into a base state, fluorescent molecules in the luminescent layer emit light. The emitted light is output through the transparent first electrode layer 64.

Since the main substrate 51 is made of a flexible synthetic resin material, the thickness of an organic electroluminescent display device can be greatly reduced, a curvature of an image formation surface can be changed freely, and a scroll display can be implemented.

As described above, according to the present invention, a flexible organic electroluminescent display device can be manufactured using an auxiliary substrate made of glass without changing the conventional processing conditions for forming a TFT layer and an organic electroluminescent unit. In addition, the present invention uses a main substrate made of a synthetic resin material, i.e., a plastic substrate, thereby implementing an active matrix type organic electroluminescent display device having a high resolution and remarkably reducing the thickness of the display device. In addition, since an organic electroluminescent unit is formed on an auxiliary substrate and then moved onto a flexible substrate, stability of the processes and yield of products can be greatly increased.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent display device comprising:
   a main substrate, which has a flat side and is flexible;
   a second protective layer, which is formed on the main substrate;
   an organic electroluminescent unit, which is formed on the second protective layer;
   a first protective layer, which is formed on the organic electroluminescent unit;
   a sealing portion, which hermetically seals the organic electroluminescent unit;
   a flexible sub-substrate bonded onto the first protective layer; and
   an organic protection layer formed on the flexible sub-substrate.

2. The organic electroluminescent display device of claim 1, wherein the first protective layer comprises a plurality of layers to prevent permeation of oxygen, moisture, and a liquid etchant.

3. The organic electroluminescent display device of claim 1, wherein the flexible sub-substrate is made of a synthetic resin material or glass.

4. The organic electroluminescent display device of claim 1, wherein the organic electroluminescent unit comprises:
   a second electrode layer, which is formed on the second protective layer;
   an organic layer, which is formed on the second electrode layer;
   a first electrode layer, which is formed on the organic layer; and
   a thin-film transistor layer, which is connected to the first electrode layer penetrating through an insulation layer to drive the first electrode layer.

5. The organic electroluminescent display device of claim 4, wherein the thin-film transistor layer is positioned on the second electrode layer far away from the main substrate.

6. An organic electroluminescent display device comprising:
   a main substrate, which has a flat side and is flexible;
   a second protective layer, which is formed on the main substrate;
   an organic electroluminescent unit, which is formed on the second protective layer;
   a first protective layer, which is formed on the organic electroluminescent unit;
   a sealing portion, which hermetically seals the organic electroluminescent unit; and
   an organic protection layer formed on the first protective layer.

7. The organic electroluminescent display device of claim 1, wherein the main substrate comprises a plurality of layers to prevent permeation of oxygen and moisture.

8. The organic electroluminescent display device of claim 1, wherein the main substrate has a thickness of 20-500 μm.

9. The organic electroluminescent display device of claim 1, wherein the flexible sub-substrate has a thickness of 20-500 μm.

* * * * *